US007323872B1

(12) United States Patent
Takahashi et al.

(10) Patent No.: US 7,323,872 B1
(45) Date of Patent: Jan. 29, 2008

(54) METHOD AND APPARATUS OF DIRECTLY MEASURING CROSS-AXIS EDDY CURRENTS FOR MR SCANNER CALIBRATION

(75) Inventors: Atsushi Mark Takahashi, Menlo Park, CA (US); Richard Scott Hinks, Waukesha, WI (US)

(73) Assignee: General Electric Company, Schenectady, NY (US)

( * ) Notice: Subject to any disclaimer, the term of this patent is extended or adjusted under 35 U.S.C. 154(b) by 42 days.

(21) Appl. No.: 11/278,900

(22) Filed: Apr. 6, 2006

(51) Int. Cl.
*G01V 3/00* (2006.01)
(52) U.S. Cl. ...................... 324/309; 324/307
(58) Field of Classification Search .......... 324/309, 324/307, 312, 313
See application file for complete search history.

(56) References Cited

U.S. PATENT DOCUMENTS 4,752,734 A 6/1988 Wedeen
5,770,943 A * 6/1998 Zhou ........................... 324/307
6,160,397 A * 12/2000 Washburn et al. ............ 324/309
6,989,672 B2 * 1/2006 Zhang ......................... 324/307
2005/0040824 A1 * 2/2005 Zhang ......................... 324/307

OTHER PUBLICATIONS

Alley, M., Gradient Characterization Using a Fourier-Transform Technique, Magn.Reson.Med. 39:581-587.
Duyn, J.H., Simple Correction Method for k-Space Trajectory Deviations in MRI, J.Magn.Reson. 132:150-153.
Onodera, T., A Method of Measuring Field-Gradient Modulation Shapes. Application to High-Speed NMR Spectroscopic Imaging, J.Phys.E:Sci.Instrum. 20:416-419.
Takahashi, A., Compensation of Multi-Dimensional Selective Excitation Pulses Using Measured k-Space Trajectories, Magn.Reson. Med. 34:446-456.

* cited by examiner

*Primary Examiner*—Louis M. Arana
(74) *Attorney, Agent, or Firm*—Ziolkowski Patent Solutions Group, SC

(57) ABSTRACT

A pulse sequence is defined to acquire calibration MR data used to characterize on-axis and cross-axis eddy currents resulting from gradient pulses used to spatially encode MR data. The amplitudes and time constants of those eddy currents can then be measured and used to guide calibration of an MRI system to reduce image artifacts.

20 Claims, 3 Drawing Sheets

METHOD AND APPARATUS OF DIRECTLY MEASURING CROSS-AXIS EDDY CURRENTS FOR MR SCANNER CALIBRATION

BACKGROUND OF THE INVENTION

The present invention relates generally to magnetic resonance (MR) imaging and, more particularly, to directly measuring cross-axis eddy currents for calibrating MR scanners. As cross-axis currents can contribute to less than ideal image quality, the present invention overcomes the drawbacks typically associated with conventional on-axis only and cross-axis measurement and scanner calibration techniques.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

In several MR data acquisition techniques, positive and negative gradient pulses are applied to spatially encode the signal emitted by excited spins. This switching of the gradient pulses between positive polarity and negative polarity has been found to produce eddy currents. Conventionally, it has been assumed that the eddy currents manifested themselves on the same axis on which the gradients were being switched. For example, if gradient switching is carried out on the $G_x$ axis, it has heretofore been assumed that any eddy currents produced by the switching on the $G_x$ axis will also manifest themselves on that same $G_x$ axis. However, as gradient slew-rates have increased, it has been found that eddy currents manifest themselves on the cross axes, e.g., $G_y$, or $G_z$.

Specifically, pulsed gradient waveforms applied on one axis have been found to produce eddy currents on the orthogonal axes. These cross-axis eddy currents are a superposition of eddy currents with a wide range of time constants and have been found to slow the response time of gradient coils thereby negatively affect gradient coil performance. A number of techniques have been proposed to reduce the impact of on-axis and cross-axis eddy currents; however, these proposed techniques are believed to be unreliable for measuring cross-axis eddy currents having short time constants.

It would therefore be desirable to have a system and method capable of directly measuring cross-axis eddy currents that is also reliable for such eddy currents having short time constants.

BRIEF DESCRIPTION OF THE INVENTION

The present invention provides a system and method for directly measuring on-axis and cross-axis eddy currents that overcomes the aforementioned drawbacks. In this regard, the present invention provides a direct method to measure on-axis and cross-axis eddy currents that are typically responsible for image artifacts, like the so called "Nyquist ghost" artifacts and in phase contrast velocity measurement errors. The present invention is particularly applicable for acquiring calibration data for calibrating MRI systems to improve image quality and pulse sequences sensitive to phase errors such as echo planer imaging (EPI) and phase contrast flow velocity measurements. The present invention utilizes a "cross-encoding" technique whereby phase encoding is applied to non-test gradient axes that are orthogonal to a test gradient. Furthermore, the number of phase encoding steps as well as step sizes are reduced so as to cover the k-space extent expected by the off-axis or cross-axis eddy currents.

Therefore, in accordance with one aspect of the present invention, a method is disclosed that includes the steps of applying a cross-encoding gradient on a first cross-encoding axis and applying a self-encoding gradient on a test axis orthogonal to the first cross-encoding axis. The method further includes the steps of applying a test gradient on the test axis and acquiring a first MR dataset after application of the test gradient. Cross-axis eddy current behavior on the test axis is characterized from the first MR dataset.

In accordance with another aspect of the invention, the invention is embodied in a computer program stored on a computer readable storage medium and having instructions which, when executed by a computer, cause the computer to executive a pulse sequence to measure cross-axis eddy currents. The pulse sequence is defined by a cross-encoding gradient pulse applied on a first axis as well as a self-encoding gradient pulse applied on a test axis orthogonal to the first axis. The pulse sequence is further defined by a test gradient pulse applied after the self-encoding gradient pulse on the test axis whereupon a readout window that begins between application of the self-encoding gradient and the test gradient pulse is used for data acquisition.

In accordance with another aspect of the invention, an MRI apparatus includes an MRI system having a plurality of gradient coils positioned about a bore of a magnet to impress a polarizing magnetic field. An RF transceiver system and an RF switch are controlled by a pulse module to transmit and receive RF signals to and from an RF coil assembly to acquire MR images. The MRI apparatus also includes a computer programmed to acquire MR data of an object and directly measure cross-axis eddy currents from the acquired MR data.

Various other features and advantages of the present invention will be made apparent from the following detailed description and the drawings.

BRIEF DESCRIPTION OF THE DRAWINGS

The drawings illustrate one preferred embodiment presently contemplated for carrying out the invention.

In the drawings.

DETAILED DESCRIPTION OF THE PREFERRED EMBODIMENT

Figure 1:
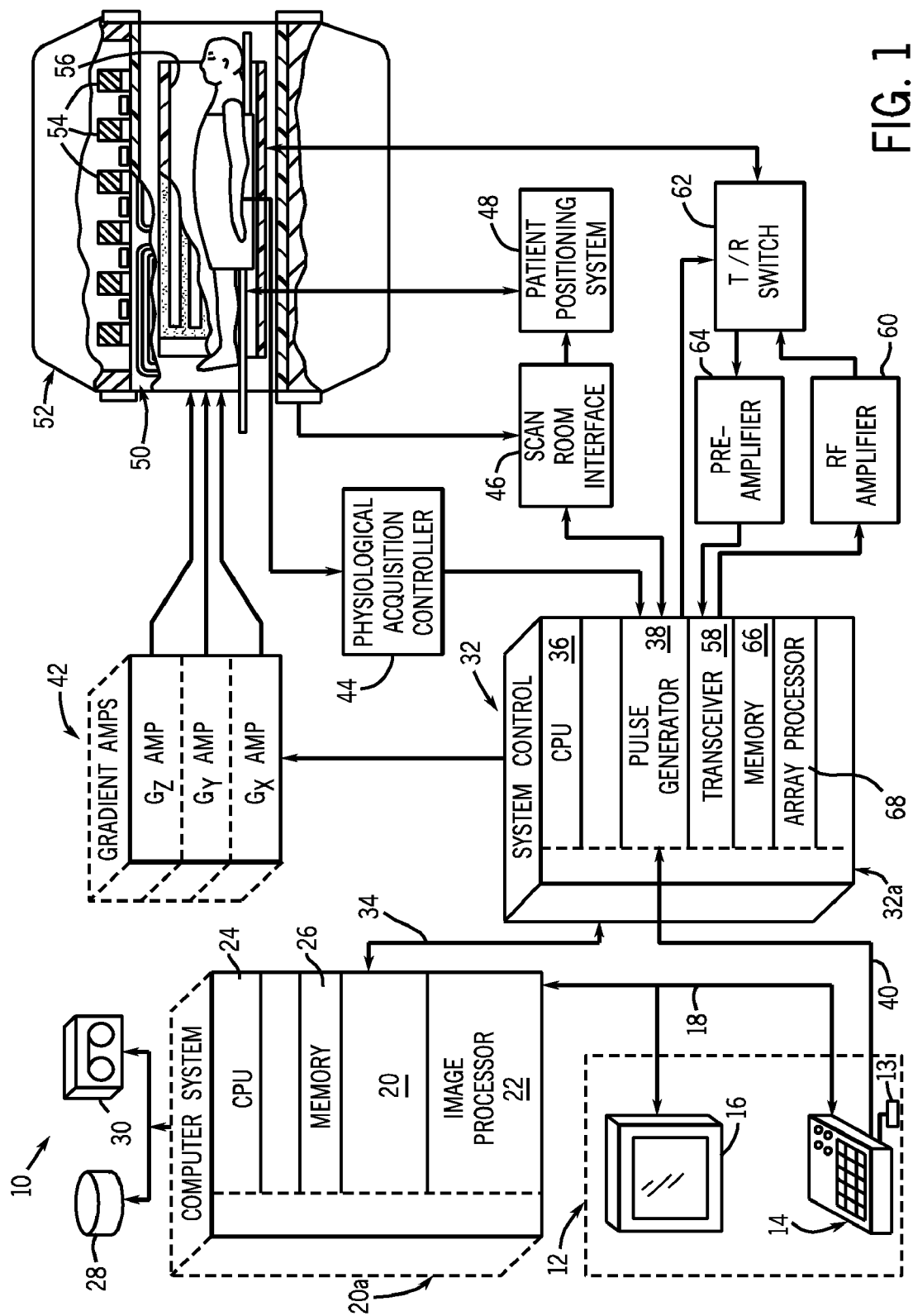
FIG. 1 is a schematic block diagram of an MR imaging system for use with the present invention.

Referring to FIG. 1, the major components of a preferred magnetic resonance imaging (MRI) system 10 incorporating the present invention are shown. The operation of the system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to disk storage 28 and tape drive 30 for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having $G_x$, $G_y$, and $G_z$ amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory, such as disk storage 28. In response to commands received from the operator console 12, this image data may be archived in long term storage, such as on the tape drive 30, or it may be further processed by the image processor 22 and conveyed to the operator console 12 and presented on the display 16.

The MRI system of FIG. 1, and equivalents thereof, typically is subject to a number of calibration techniques. Calibrations are often carried out before delivery of a particular scanner, but additional calibrations are carried out once the scanner is delivered and set-up. Additionally, calibrations are often performed on a per-patient basis or as part of an on-going maintenance routine. In this regard, calibrations are often executed by acquiring data of a phantom or other object. These phantoms can take many forms depending upon the particular calibrations to be performed. As will be described below, the present invention preferably acquires MR data of a spherical, uniform phantom to calibrate the MRI system to reduce cross-axis and on-axis eddy currents. Furthermore, the invention acquires calibration data without a significant increase in scan time.

In particular, the present invention is directed to a pulse sequence that is played out by the MRI system to acquire MR data for calibration purposes. It is contemplated that the pulse sequence can be played out as part of a global calibration process, facility-wide calibration process, per-scanner calibration process, and/or per-scan calibration process. The pulse sequence is embodied in instructions of a computer program stored in readable memory of the MRI system that is called and executed in a conventional manner. The computer program may also be embodied in computer data signal that is downloaded or uploaded to an MRI system via a carrier wave.

Figure 2:
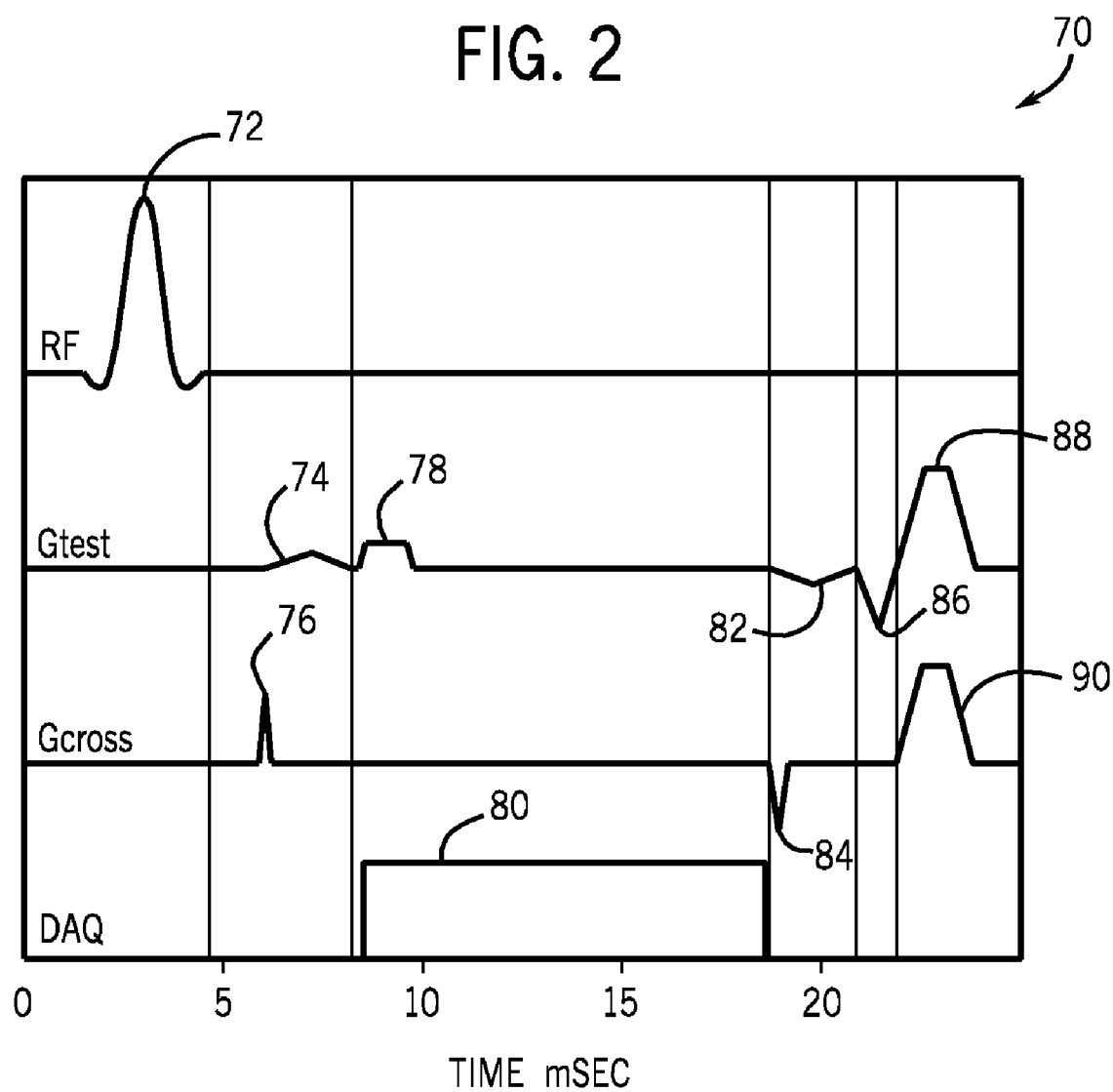
FIG. 2 is a schematic illustrating a pulse sequence used to measure on-axis and cross-axis eddy currents according to one aspect of the present invention.

Referring now to FIG. 2, an exemplary pulse sequence for acquiring MR data for directly measuring cross-axis eddy currents is schematically shown. The calibration sequence 70 includes a non-selective RF pulse 72 that tips the spins within an imaging volume into the transverse plane. The non-selective RF pulse reduces the likelihood of inducing eddy currents with a slice select gradient. Thereafter, a self-encoding gradient pulse 74 and a cross-encoding gradient pulse 76 are played simultaneously on the test axis and an orthogonal cross-axis, respectively. In the figure, the test axis is the z-axis and the cross-axis is either the x-axis or the y-axis. Following the self-encoding gradient pulse 74 on the test (z) axis is a test gradient pulse 78. Preferably, the test gradient pulse 78 is applied following observance of a short delay after application of the self-encoding and cross-encoding gradients. In one exemplary embodiment, 256 µs pass before application of the test gradient pulse on the test axis.

MR data is acquired in a readout window 80 that begins between application of the self-encoding gradient pulse 74 and the test gradient pulse 78. The readout window effectively defines a test period that is used to acquire MR data that includes on-axis and cross-axis eddy current information that can be analyzed and processed for MRI system calibration.

Following the end of the readout or data acquisition window 80, both the self-encoding gradient field and the cross-encoding gradient field are rephased by a rephasing self-encoding gradient pulse 82 and a rephasing cross-encoding gradient pulse 84, respectively. The test gradient field is then rephased by a rephasing test gradient pulse 86. Killer gradients 88 and 90 are then applied on the test axis and the cross-encoding axis, respectively, to dephase any transverse magnetization present on the test and cross-encoding axes. The pulse sequence is then repeated after another time delay, preferably of one hundred milliseconds. The pulse sequence is repeated a number of times until a desired dataset is acquired.

In this regard, the self and cross-encoding gradient pulses are stepped in a 2D raster fashion to acquire the desired dataset. This stepping results in a 3D dataset ($k_{cross-encoding\_axis}$, $k_{test\_axis}$, time). When this 3D dataset is acquired, the cross-encoding axis is switched to the other orthogonal axis, and the data acquisition process is repeated. That is, if the test axis is the z-axis and the first cross-axis is the x-axis, then the first dataset that is acquired is $k_x$, $k_z$, time. When the cross-axis is switched, the acquired 3D dataset is $k_y$, $k_z$, time. The acquisition of MR data in this manner allows for characterization of cross-axis eddy current behavior from application of gradient pulses on both orthogonal axes. In one exemplary embodiment, a 10 cm spherical phantom is placed at the iso-center of the MRI system and once shimmed is used to acquire the on-axis and cross-axis information.

As noted above, the cross-encoding and self-encoding gradients are stepped in a 2D raster fashion. The step size in the self-encoding direction is preferably set to $\Delta k_z = 1/FOV$ thereby resulting in a phase encoded image with a field-of-view (FOV) larger than the phantom, e.g., 15 cm for a 10 cm phantom. One of a number of algorithms may be used to extract on-axis k-space trajectory information from the acquired 3D dataset. One exemplary technique is described by Alley, M., Magn.Reson.Med. 39:581-587, the disclosure which is incorporated herein.

To measure the k-space trajectory along the cross-axis directions, a $\Delta k_x$ and a $\Delta k_y$ that are a fraction of the $\Delta k_z$ are selected, e.g. 10% of $\Delta k_z$. It is also preferred to reduce the number of cross-encoding steps relative to the number of self-encoding steps to reduce scan time. The k-space trajectories along the respective orthogonal directions can then be found by locating the peak of the signal in the self-encoding direction. That is, with a well-shimmed phantom, the magnitude of the MR (k-space) data in the cross-encoding direction is a Jinc-like function and its central part can be fit to a quadratic function that can be plotted as a parabola. In this regard, the peak of the fitted parabola can then be used to determine the on-axis and cross-axis k-space trajectories. Specifically, eddy current amplitudes and time constants can be can be derived in a conventional manner and used by conventional calibration algorithms to control gradient coil performance to reduce the impact of eddy currents.

Figure 3:
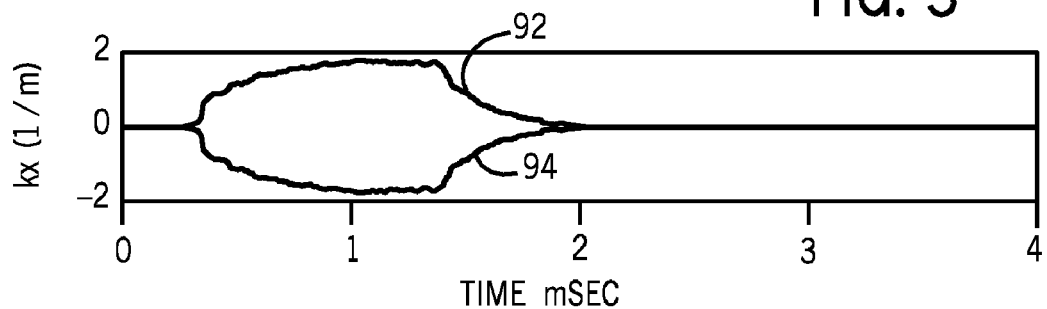
FIG. 3 is a waveform illustrating an exemplary $k_x$ k-space trajectory in accordance with one aspect of the present invention.
Figure 4:
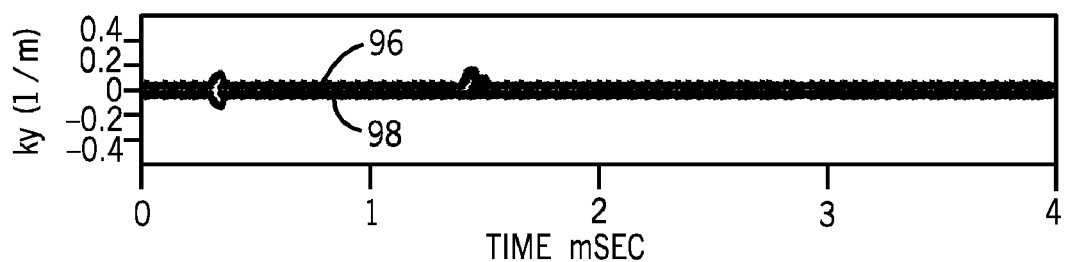
FIG. 4 illustrates an exemplary $k_y$ k-space trajectory measured in accordance with one aspect of the present invention.
Figure 5:
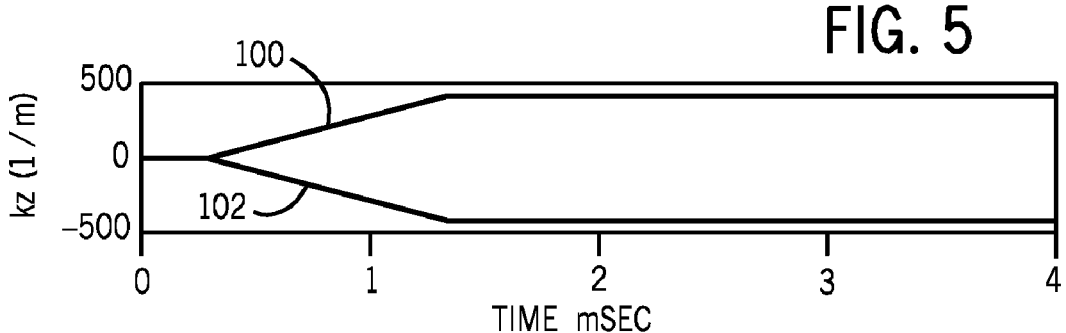
FIG. 5 illustrates an exemplary on-axis k-space trajectory measured in accordance with one aspect of the present invention.
Figure 6:
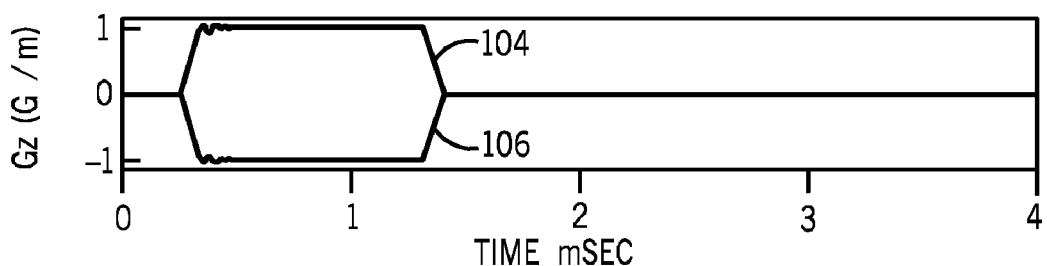
FIG. 6 is a measured gradient waveform determined by taking the derivative of the measured on-axis $k_z$ trajectory of FIG. 5 in accordance with the present invention.

Exemplary measured k-space trajectories for a trapezoidal test gradient are shown in FIGS. 3-5. Specifically, the $k_x$ trajectories 92, 94 are shown in FIG. 3, the $k_y$ trajectories 96, 98 are shown in FIG. 4, and the $k_z$ trajectories 100, 102 are shown in FIG. 5. Trajectories 92, 96, and 100 correspond to those measured with a positive going trapezoidal gradient pulse and trajectories 94, 98, and 102 correspond to those measured with a negative going trapezoidal gradient pulse. As shown, cross-axes trajectories ($k_x$ and $k_y$) are relatively small compared to the on-axis ($k_z$) trajectories. The trapezoidal on-axis gradient pulses 104, 106, which, for purposes of illustration, were derived from the derivative of the on-axis measured trajectories, are shown in FIG. 6. The $k_z$ trajectories are consistent with trapezoidal test gradient pulses.

As noted above, the waveform can be analyzed to derive time constants and amplitudes for the on-axis and cross-axis eddy currents. The corresponding values can then be input to the MRI scanner that executes a calibration algorithm to determine operational parameters that will reduce on-axis and cross-axis eddy currents during data acquisition.

The invention has been described with respect to a pulse sequence, and system for its implementation, to acquire calibration MR data for characterizing on-axis and cross-axis eddy currents resulting from gradient pulses used to spatially encode MR data. The amplitudes and time constants of those eddy currents can then be measured and used to guide calibration of an MRI system to reduce image artifacts.

The invention may also be embodied in a method that includes the steps of applying a cross-encoding gradient on a first cross-encoding axis and applying a self-encoding gradient on a test axis orthogonal to the first cross-encoding axis. The method further includes the steps of applying a test gradient on the test axis and acquiring a first MR dataset after application of the test gradient. Cross-axis eddy current behavior on the test axis is characterized from the first MR dataset.

The invention is also embodied in a computer program stored on a computer readable storage medium and having instructions which, when executed by a computer, cause the computer to executive a pulse sequence to measure cross-axis eddy currents. The pulse sequence is defined by a cross-encoding gradient pulse applied on a first axis as well as a self-encoding gradient pulse applied on a test axis orthogonal to the first axis. The pulse sequence is further defined by a test gradient pulse applied after the self-encoding gradient pulse on the test axis whereupon a readout window that begins between application of the self-encoding gradient and the test gradient pulse is used for data acquisition.

The present invention has been described in terms of the preferred embodiment, and it is recognized that equivalents, alternatives, and modifications, aside from those expressly stated, are possible and within the scope of the appending claims.

What is claimed is:

1. A method comprising the steps of:
   applying a cross-encoding gradient on a first cross-encoding axis;
   applying a self-encoding gradient on a test axis orthogonal to the cross-encoding axis;
   applying a test gradient on the test axis;
   acquiring a first MR dataset after application of the test gradient; and
   characterizing cross-axis eddy current behavior on the test axis from the first MR dataset.

2. The method of claim 1 wherein the self-encoding gradient and the first cross-encoding gradient are applied simultaneously.

3. The method of claim 1 wherein the test axis is the z-axis and the cross-encoding axis is either the x- or y-axis.

4. The method of claim 1 wherein the data acquisition is repeatedly carried out until a 3D dataset is acquired.

5. The method of claim 4 further comprising the steps of stepping the self-encoding and the cross-encoding gradients in a 2D raster fashion for acquisition of the 3D dataset.

6. The method of claim 1 further comprising the step of observing a pre-set delay after application of the self-encoding and cross-encoding gradients before application of the test gradient.

7. The method of claim 1 further comprising the steps of:
   applying the cross-encoding gradient on a second cross-encoding axis different from and orthogonal to the test axis and the first cross-encoding axis;
   repeating application of the self-encoding gradient on the test axis;
   applying another test gradient on the test axis;
   acquiring a second MR dataset after application of the another test gradient on the test axis; and
   characterizing cross-axis eddy current behavior on the test-axis from the second MR dataset.

8. The method of claim 7 wherein the test axis is the z-axis and wherein the steps of characterizing cross-axis eddy current behavior includes measuring k-space trajectories on the x, y, and z axes and determining cross-eddy currents on the x and the y axes from the measured k-space trajectories.

9. The method of claim 8 further comprising the step of calibrating an MR scanner to reduce cross-axis eddy current artifacts during image data acquisition.

10. The method of claim 9 wherein the MR data is acquired of a phantom with a given $T_2$ value and the MR scanner is calibrated for eddy currents shorter in duration than the given $T_2$ value of the phantom.

11. A computer readable storage medium having a computer program stored thereon for calibrating an MR scanner and representing a set of instructions that when executed by a computer causes the computer to execute a pulse sequence to measure cross-axis eddy currents, the pulse sequence defined by:
    a cross-encoding gradient pulse applied on a first axis;
    a self-encoding gradient pulse applied on a test orthogonal to the first axis;
    a test gradient pulse applied after the self-encoding gradient pulse on the test axis; and
    a readout window that begins between application of the self-encoding gradient pulse and the test gradient pulse.

12. The computer readable storage medium of claim 11 wherein the pulse sequence is further defined by:
    a rephasing cross-encoding gradient pulse played out after the readout window;
    a rephasing self-encoding gradient pulse played out after the readout window;
    a rephasing test gradient pulse played out after the readout window; and
    a plurality of killer gradients played out after the rephasing gradient pulses to dephase residual transverse magnetization on a plurality of axes.

13. The computer readable storage medium of claim 12 wherein the computer is further caused to repeat execution of the pulse sequence with stepping of the cross-encoding and self-encoding gradient pulses in a 2D raster fashion to acquire a 3D dataset defined as $k_{orthogonal-axis}$, $k_{test-axis}$, time.

14. The computer readable storage medium of claim 11 wherein the computer is further caused to measure k-space trajectories on an x-z plane and measure k-space trajectories on a y-z plane.

15. The computer readable storage medium of claim 11 wherein the computer is further caused to first execute the pulse sequence with a positive going test gradient pulse and then execute the pulse sequence with a negative going test gradient pulse, acquire respective datasets with each test gradient pulse, and characterize cross-axis eddy current behavior from the respective datasets.

16. An MRI apparatus comprising:
    a magnetic resonance imaging (MRI) system having a plurality of gradient coils positioned about a bore of a magnet to impress a polarizing magnetic field and an RF transceiver system and an RF switch controlled by a pulse module to transmit RF signals to an RF coil assembly to acquire MR images; and
    a computer programmed to acquire MR data of an object and directly measure cross-axis eddy currents from the acquired MR data; wherein the computer is further programmed to acquire the MR data with repeated application of a calibration pulse sequence defined by:
    a cross-encoding gradient pulse applied on a cross-encoding axis;
    a self-encoding gradient pulse applied on a test axis orthogonal to the cross-encoding axis;
    a test gradient pulse applied on the test axis; and
    a readout window that begins between application of the self-encoding gradient pulse and the test gradient pulse.

17. The MRI apparatus of claim 16 wherein the computer is further programmed to acquire the MR data with phase encoding of either one of two gradient axes orthogonal to a test axis.

18. The MRI apparatus of claim 16 wherein the cross-encoding gradient pulse and the self-encoding gradient pulse are applied simultaneously.

19. The MRI apparatus of claim 16 wherein the object is a spherical phantom with a $T_2$ value longer than eddy currents measured in the readout window.

20. The MRI apparatus of claim 16 wherein the computer is further programmed to calibrate the MRI system to improve image quality in pulse sequences sensitive to phase errors.

* * * * *